United States Patent
Alptekin et al.

(10) Patent No.: US 8,927,422 B2
(45) Date of Patent: Jan. 6, 2015

(54) RAISED SILICIDE CONTACT

(75) Inventors: Emre Alptekin, Wappingers Falls, NY (US); Nathaniel Berliner, Albany, NY (US); Christian Lavoie, Ossining, NY (US); Kam-Leung Lee, Yorktown Heights, NY (US); Ahmet Serkan Ozcan, Pleasantville, NY (US)

(73) Assignee: International Business Machines Corporation, Armonk, NY (US)

(*) Notice: Subject to any disclaimer, the term of this patent is extended or adjusted under 35 U.S.C. 154(b) by 99 days.

(21) Appl. No.: 13/525,401

(22) Filed: Jun. 18, 2012

(65) Prior Publication Data
US 2013/0334693 A1 Dec. 19, 2013

(51) Int. Cl.
H01L 21/44 (2006.01)
H01L 21/31 (2006.01)
H01L 21/285 (2006.01)
H01L 29/66 (2006.01)
H01L 21/02 (2006.01)
H01L 21/8238 (2006.01)

(52) U.S. Cl.
CPC ........ *H01L 21/28518* (2013.01); *H01L 29/665* (2013.01); *H01L 21/02063* (2013.01); *H01L 21/823814* (2013.01); *H01L 21/28525* (2013.01)
USPC ........... 438/659; 438/664; 438/655; 438/682; 438/300; 438/597; 438/762; 438/768; 438/630; 438/649

(58) Field of Classification Search
None
See application file for complete search history.

(56) References Cited

U.S. PATENT DOCUMENTS

| | | |
|---|---|---|
| 5,924,001 A | 7/1999 | Yang et al. |
| 6,265,272 B1 | 7/2001 | Chen |
| 6,689,688 B2 | 2/2004 | Besser et al. |
| 7,544,610 B2 | 6/2009 | Cabral, Jr. et al. |
| 7,618,891 B2 | 11/2009 | Fang et al. |
| 7,682,968 B2 | 3/2010 | Cabral, Jr. et al. |
| 8,039,382 B2 | 10/2011 | Fang et al. |
| 8,039,388 B1 | 10/2011 | Ng et al. |
| 8,101,518 B2 | 1/2012 | Cabral, Jr. et al. |
| 2007/0141798 A1 | 6/2007 | Bohr |
| 2008/0274611 A1* | 11/2008 | Cabral et al. ............ 438/653 |
| 2011/0117738 A1* | 5/2011 | Russell et al. ............ 438/664 |
| 2012/0083089 A1* | 4/2012 | Kim et al. ............ 438/301 |

FOREIGN PATENT DOCUMENTS

EP 0935282 11/1999

* cited by examiner

*Primary Examiner* — Chuong A Luu
*Assistant Examiner* — Cory Eskridge
(74) *Attorney, Agent, or Firm* — L. Jeffrey Kelly; Yuanmin Cai (57) ABSTRACT

A method for forming a raised silicide contact including depositing a layer of silicon at a bottom of a contract trench using a gas cluster implant technique which accelerates clusters of silicon atoms causing them to penetrate a surface oxide on a top surface of the silicide, a width of the silicide and the contact trench are substantially equal; heating the silicide including the silicon layer to a temperature from about 300° C. to about 950° C. in an inert atmosphere causing silicon from the layer of silicon to react with the remaining silicide partially formed in the silicon containing substrate; and forming a raised silicide from the layer of silicon, wherein the thickness of the raised silicide is greater than the thickness of the silicide and the raised silicide protrudes above a top surface of the silicon containing substrate.

19 Claims, 5 Drawing Sheets

RAISED SILICIDE CONTACT

BACKGROUND

1. Field of the Invention

The present disclosure generally relates to integrated circuits, and more particularly to raised self-aligned silicide contacts.

2. Background of Invention

The technological development of micro-sized semiconductor integrated circuit devices has required improved methods for making conductive contacts to the semiconductor impurity regions. Metal silicides have proven to be excellent contact materials, which can be readily formed in a self-aligned manner by a salicidation process.

Formation of metal silicide contacts through the salicidation process typically involves the steps of depositing a thin metal layer (e.g., less than about 15 nm in thickness) that contains a silicide metal or metal alloy (i.e., a metal or metal alloy that is capable of reacting with silicon to form metal silicide) uniformly over a semiconductor substrate that contains both silicon-containing device regions and dielectric isolation regions, heating the semiconductor substrate to form silicide over the device regions, and then selectively etching away the un-reacted metal from the dielectric isolation regions.

Silicide formation and morphology control with known methods is not reliable and precise enough for semiconductor devices with a gate length less than 20 nm. Current methods produce non-uniform silicide depth and non-uniform encroachment of the silicide beneath the gate stack. Encroachment of the silicide beneath the gate stack occurs when metal diffuses and reacts too deep vertically or laterally into the substrate and interacts with crystalline defects. This non-uniformity limits production yield and device performance. Yield may be reduced due to junction leakage and device short circuits while device performance is compromised by high parasitic resistance.

Further, current silicidation methods for forming metal silicides on SiGe substrates having high concentrations of Ge have thermal stability and roughness issues. When a silicide forms on a SiGe substrate, the Ge is incorporated into the silicide replacing Si atoms. The high concentration of Ge decreases the melting point of the silicide and therefore enhances the diffusion of atoms at lower temperatures. This increased diffusion of atoms is undesirable and produces unwanted non-uniformity in the resulting silicide. The non-uniformity results in a very rough interface between the silicide and the substrate with variations in vertical thickness as large as two times the intended thickness of the silicide. Further, these thickness variations cause agglomeration during subsequent processing.

In addition to the stability and roughness issues, high concentrations of Ge in a silicide decrease the process window for the selective etch technique. Standard selective etch chemistries used in self-aligned silicide formation such as sulfuric peroxide and aqua regia, become less selective to the germanosilicide, which may lead into yield issues.

There is therefore a continuing need for an improved method for fabricating the silicide contacts on semiconductor substrates, which is capable of both controlling the silicide morphology and producing more robust thermally stable metal silicides on SiGe substrates.

SUMMARY

According to one embodiment of the present disclosure, a method for forming a raised silicide contact is provided. The method may include depositing a layer of silicon directly on top of a silicide partially formed in a silicon containing substrate, wherein the silicon layer is deposited anisotropically using a gas cluster implant technique which accelerates clusters of silicon atoms causing them to penetrate a surface oxide on a top surface of the silicide, and heating the silicide including the silicon layer to a temperature from about 300° C. to about 950° C. by raising the temperature from an ambient temperature at a ramp rate from about 1° C./sec to about 35° C./sec, holding the temperature for about 0.1 miliseconds to about 600 seconds in an inert atmosphere containing less than about 10 ppm oxygen, and lowering the temperature below 100° C. within a time period from about 10 to about 600 seconds causing silicon from the layer of silicon to react with the remaining silicide partially formed in the silicon containing substrate. The method may also include forming a raised silicide from the layer of silicon, wherein the thickness of the raised silicide is greater than the thickness of the silicide and the raised silicide protrudes above a top surface of the silicon containing substrate.

According another exemplary embodiment, a raise silicide contact is provided. The raised silicide contact may include a silicon containing substrate, and a raised silicide contact, wherein the raised silicide contact comprises nickel and protrudes above a top surface of the silicon containing substrate by 5 nm to 15 nm.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the disclosure. The drawings are intended to depict only typical embodiments of the disclosure. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present disclosure which provides a method of forming a self-aligned raised silicide contact will now be described in greater detail by referring to the accompanying FIGS. 1A-1D.

Figure 1A:
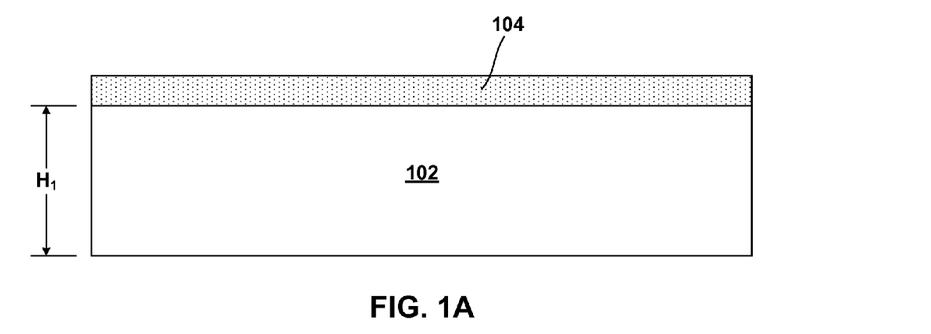
FIG. 1A a cross-sectional diagram of a step of a method of fabricating a raised silicide contact according to one exemplary embodiment.

Referring now to FIG. 1A, a structure 100 is shown. The structure 100 includes a semiconductor substrate 102. The semiconductor substrate 102 employed in the present invention may include any semiconductor material including, but not limited to: undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. The semiconductor substrate 102 may also include an organic semiconductor or a layered semiconductor such as Si/SiGe, a silicon-on-insulator (SOI) or a SiGe-on-insulator (SGOI).

In one embodiment of the present invention, the semiconductor substrate 102 may be composed of a Si-containing semiconductor material, i.e., a semiconductor material that includes silicon, such as Si (including undoped Si, n-doped Si, p-doped Si, single crystal Si, polycrystalline Si, and amorphous Si), SiGe, SiGeC, etc. The silicon contained in the semiconductor substrate 102 can react with the silicide metal subsequently deposited to form one or more silicide contacts.

In one embodiment, the semiconductor substrate 102 may not include silicon, and a silicon-containing layer (not shown) may be subsequently formed over the semiconductor substrate 102. In this manner, the subsequently formed silicon-containing layer provides the required silicon for forming the silicide contacts.

With continued reference to FIG. 1A, a metal alloy layer 104 may be deposited uniformly over the entire structure 100. The metal alloy layer 104 may be formed using conventional deposition techniques including, but not limited to: chemical vapor deposition (CVD), plasma-assisted CVD, high-density chemical vapor deposition (HDCVD), plating, sputtering, evaporation, and chemical solution deposition. The deposition of the metal alloy layer 104 may be continued until an initial thickness of about 25 nm, preferably about 15 nm, even more preferably about 10 nm, is produced.

In one embodiment, the metal alloy layer 104 may include a nickel-platinum (NiPt) alloy. The metal alloy layer 104 may include a nickel concentration ranging from about 70 to about 95 atomic percent. Preferably, nickel may be present in the alloy in an amount ranging from about 90 to about 95 atomic percent. The remainder may be platinum and, if present, another metal. In one embodiment, the metal alloy layer 104 may include NiPd, NiRe, Ti, TiTa, TiNb, or Co.

The other metal or alloying additive that can be optionally present in the NiPt alloy layer may include Pd, Rh, Ti, V, Cr, Zr, Nb, Mo, Hf, Ta, W, or Re. In one embodiment, the other alloying additive is Re. When present, the alloying additive is present in an amount ranging from about 0 to about 50 atomic percent with an amount ranging from about 0.1 to about 20 atomic percent being more typical. More preferably, the other metal is present in an amount ranging from about 0.5 to about 10 atomic percent.

Figure 1B:
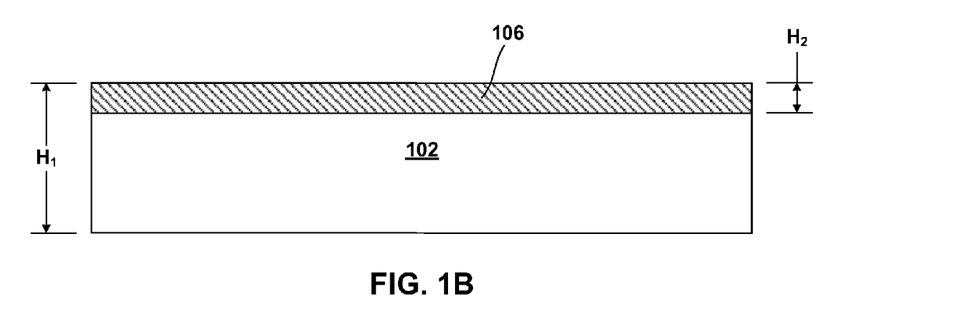
FIG. 1B a cross-sectional diagram of a step of a method of fabricating a raised silicide contact according to one exemplary embodiment.

Referring now to FIG. 1B, a first annealing step may be carried out at a relatively low annealing temperature, ranging from about 150° C. to about 500° C. using either a continuous heating regime or various ramp and soak heating cycles, for a duration ranging from about 1 second to about 1000 seconds. More preferably, the first annealing step may be carried out at an annealing temperature ranging from about 200° C. to about 400° C. and for a duration ranging from about 1 second to about 500 seconds. Most preferably, the first annealing step may be carried out at an annealing temperature ranging from about 250° C. to about 350° C. and for a duration from about 5 seconds to about 100 seconds. In one embodiment, the first annealing step may be initiated by raising the surrounding temperature of the entire structure from ambient temperature to the desired annealing temperature at a ramp rate from about 1° C./second to about 35° C./second, more preferably from about 5° C./second to about 25° C./second, and most preferably from about 10° C./second to about 20° C./second. Further, it is preferred that the first annealing step may be terminated by lowering the surrounding temperature of the entire structure to below 100° C. within a time period from about 10 seconds to about 1000 seconds.

The first annealing step, as described above, may be generally referred to as a low-temperature rapid thermal annealing (RTA) step. As a result of the low-temperature RTA step, nickel contained in the metal alloy layer 104 (shown in FIG. 1A) reacts with silicon contained in the semiconductor substrate 102 to form an embedded silicide contact 106. The embedded silicide contact 106 may contain at least $Ni_2Si$, formed by the reaction between nickel and silicon at the relatively low annealing temperature and may be characterized by a relatively higher resistivity in comparison with NiSi. The embedded silicide contact 106 may further contain platinum, which may not react with silicon to form a silicide at the low annealing temperature. The embedded silicide contact 106 formed after the low-temperature RTA step, may extend into the semiconductor substrate about 5 nm to about 30 nm, with a depth from about 5 nm to about 20 nm being even more typical (see $H_2$ in FIG. 1B).

Figure 1C:
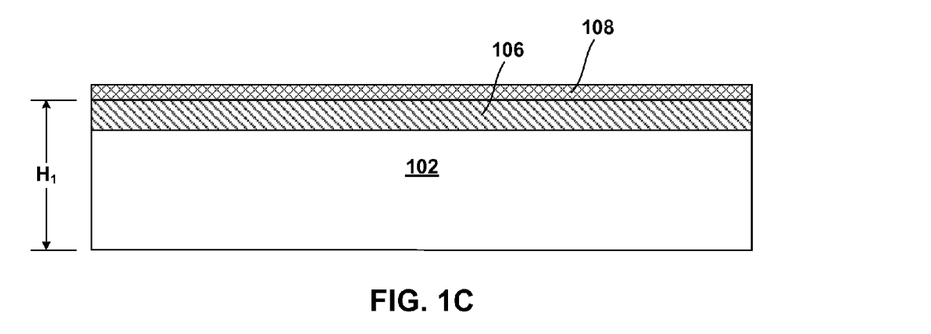
FIG. 1C a cross-sectional diagram of a step of a method of fabricating a raised silicide contact according to one exemplary embodiment.

Referring now to FIG. 1C, a silicon layer 108 may be deposited anisotropically over the entire structure 100. The silicon layer 108 may be formed using a gas cluster implant deposition technique which accelerates clusters of silicon atoms causing them to penetrate the surface at which they are directed. Each cluster may contain thousands of silicon atoms. This technique allows for the deposited silicon atoms to penetrate through a surface oxide that may form on the top surface of the embedded silicide contact 106 and react with the $Ni_2Si$ silicide.

Conventional deposition techniques such as, for example, sputter deposition, physical vapor deposition (PVD), chemical vapor deposition (CVD), atomic layer deposition (ALD), and molecular beam epitaxy (MBE) may not be used because they do not have the appropriate energetic deposition needed to penetrate through the surface oxide formed on the top surface of the silicide. The silicon layer 108 may have a thickness ranging from about 2 nm to about 10 nm. In one embodiment, the silicon layer 108 may have a thickness ranging from about 5 nm to about 7 nm.

Figure 1D:
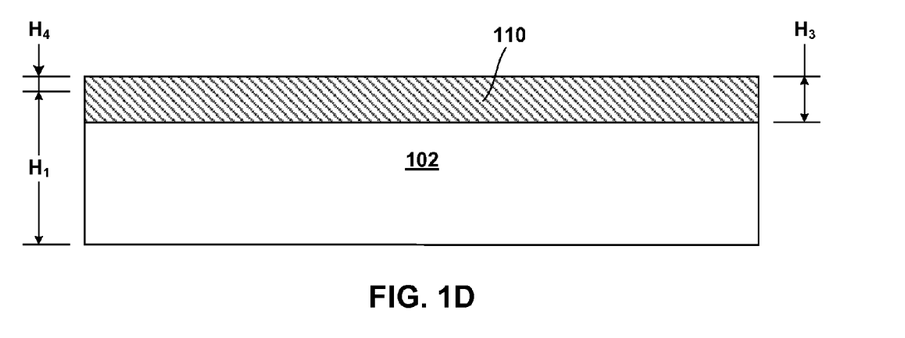
FIG. 1D a cross-sectional diagram of a step of a method of fabricating a raised silicide contact according to one exemplary embodiment.

Now referring to FIG. 1D, a second annealing step may be carried out at a relatively high annealing temperature, ranging from about 300° C. to about 900° C. using either a continuous heating regime or various ramp and soak heating cycles, for a duration ranging from about 0.1 milliseconds to about 600 seconds. More preferably, the second annealing step may be carried out at an annealing temperature ranging from about 350° C. to about 550° C. Most preferably, the second annealing step may be carried out at an annealing temperature ranging from about 400° C. to about 500° C. and for a duration from about 10 seconds to about 100 seconds.

In one embodiment, referred to as a millisecond anneal, the second annealing step may be carried out at an annealing temperature ranging from about 650° C. to about 950° C. for a duration ranging from 0.1 milliseconds to about 1 millisecond. In one embodiment, the second annealing step may be initiated by raising the surrounding temperature of the entire structure from ambient temperature to the desired annealing temperature at a ramp rate from about 1° C./second to about 35° C./second, more preferably from about 5° C./second to about 25° C./second, and most preferably from about 10° C./second to about 20° C./second. Further, the second annealing step may be terminated by lowering the surrounding temperature of the entire structure to below 100° C. within a time period from about 10 seconds to about 600 seconds. It is critical to control the thermal budget and soak times to maintain the morphology and desired thermal stability of the raised silicide.

The second annealing step, as described above, may be generally referred to as a high-temperature rapid thermal annealing (RTA) step. As a result of the high-temperature RTA step, $Ni_2Si$ contained in the embedded silicide contact 106 (shown in FIG. 1C) further reacts with silicon in the silicon layer 108 to form a completely silicidated, raised silicide contact 110 as shown in FIG. 1D. The raised silicide contact 110 may contain NiSi that is characterized by a relatively lower resistivity than $Ni_2Si$.

The raised silicide contact 110, formed after the high-temperature RTA step, may have a thickness ($H_3$) ranging from about 10 nm to about 20 nm. The raised silicide contact 110 may extend above the semiconductor substrate about 5 nm to about 15 nm, with a height ($H_4$) above the top surface of the semiconductor substrate from about 7 nm to about 10 nm being even more typical. The raised silicide contact 110 may be thicker than the embedded silicide contact 106; e.g. $H_3$ may be greater than $H_2$ as shown in FIGS. 1B & 1D.

By using the silicon layer 108 (shown in FIG. 1C) increased control over the formation and morphology of the raised silicide contact 110 may be achieved. Furthermore, risk of junction leakage may be reduced as a result of the increase control over formation and morphology which may result in higher production yield. The increased control over the formation of the silicide contacts yields raised silicide contacts having uniform depth, or thickness, as well as uniform encroachment of the silicide beneath the gate stack. Both uniform depth and uniform encroachment further reduce the risk of junction leakage.

Note that both the first and second annealing steps may be carried out in a gas atmosphere, e.g., He, Ar, $N_2$, or forming gas. They may be carried out in different atmospheres or in the same atmosphere. For example, He may be used in both annealing steps, or He can be used in the first annealing step and a forming gas may be used in the second annealing step.

The present disclosure which provides a method of forming self-aligned raised silicide contacts will now be described in greater detail by referring to the accompanying FIGS. 2A-2F.

Figure 2A:
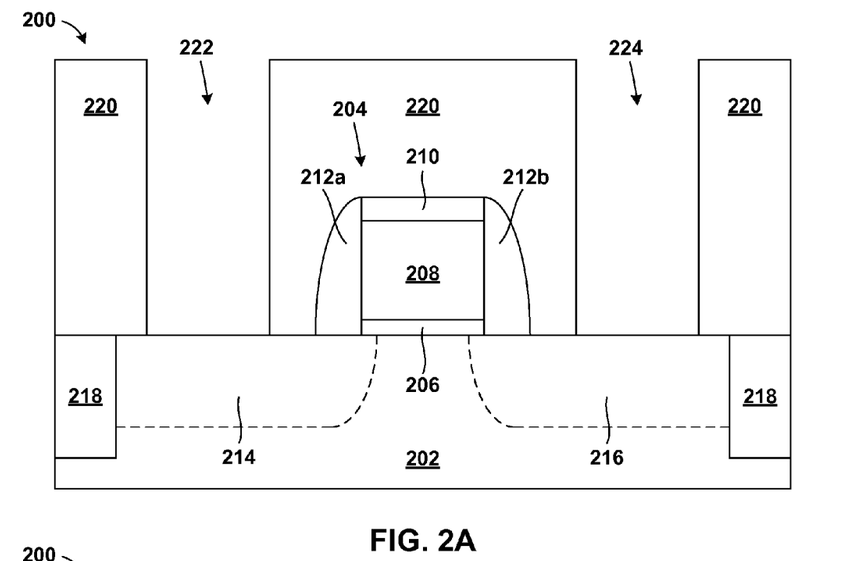
FIG. 2A a cross-sectional diagram of a step of a method of fabricating raised silicide contacts for a semiconductor device according to one exemplary embodiment.

Referring now to FIG. 2A, a structure 200 is shown. The structure 200 may include a semiconductor substrate 202 that has at least one gate region 204 located on a top surface of the semiconductor substrate 202. Each gate region 204 may include a gate dielectric 206, a gate conductor 208, a dielectric cap 210, a pair of spacers 212a, 212b. Further, a source region 214, and a drain region 216 may be located within the semiconductor substrate 202. A single gate region 204 is provided for illustrative purposes only. It should be noted that the present invention is not limited to only a single gate region. Instead, the present invention works when the substrate 202 includes a plurality of gate regions.

The semiconductor substrate 202 employed in the present invention may include any semiconductor material including, but not limited to: undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. The semiconductor substrate 202 may also include an organic semiconductor or a layered semiconductor such as Si/SiGe, a silicon-on-insulator (SOI) or a SiGe-on-insulator (SGOI).

In one embodiment of the present invention, the semiconductor substrate 202 may be composed of a Si-containing semiconductor material, i.e., a semiconductor material that includes silicon, such as Si (including undoped Si, n-doped Si, p-doped Si, single crystal Si, polycrystalline Si, and amorphous Si), SiGe, SiGeC, etc. The silicon contained in the semiconductor substrate 202 can react with the silicide metal subsequently deposited to form one or more silicide contacts.

In one embodiment, the semiconductor substrate 202 may not include silicon, and a patterned silicon-containing layer (not shown) may be subsequently formed over the semiconductor substrate 202 to selectively cover only the desired source/drain regions 214, 216. In this manner, the subsequently formed patterned silicon-containing layer provides the required silicon for forming the silicide contacts.

The semiconductor substrate 202 may be doped, undoped or contain both doped and undoped regions therein. These doped regions are known as "wells" and can be used to define various device regions, for example the source/drain regions 214, 216. The source/drain regions 214, 216, for example, may be either n-doped or p-doped. Typically, n-doped source/drain regions are used for forming p-channel field effect transistors (p-FETs), and p-doped source/drain regions are used for forming n-channel field effect transistors (n-FETs). However, the source/drain regions of one device on a semiconductor substrate may be n-doped while the source/drain regions of another device on the same semiconductor substrate may be p-doped.

Multiple dielectric isolation regions 218 are formed in the semiconductor substrate 202 to isolate adjacent source/drain regions 214, 216. The dielectric isolation regions 218 are typically formed using trench isolation techniques that are well known to a person of ordinary skill in the art including, for example, forming a patterned mask on the surface of the substrate via lithography, etching a trench into the substrate thru an opening in the patterned mask, filling the trench with a trench dielectric such as $SiO_2$ or TEOS and planarizing the structure. An optional trench liner can be formed within the trench prior to trench dielectric fill and an optional densification step may follow the planarization process.

A gate dielectric layer may be formed on the entire surface of the structure 200 including the semiconductor substrate 202 and atop the dielectric isolation regions 218. The gate dielectric layer will subsequently form a gate dielectric 206. The gate dielectric layer can be formed by a thermal growing process such as, for example, oxidation, nitridation or oxynitridation. Alternatively, the gate dielectric layer can be formed by a deposition process such as, for example, chemical vapor deposition (CVD), plasma-assisted CVD, atomic layer deposition (ALD), evaporation, reactive sputtering, chemical solution deposition or other like deposition processes. The gate dielectric layer may also be formed using any combination of the above processes.

The gate dielectric layer may be comprised of an insulating material including, but not limited to: an oxide, nitride, oxynitride or silicate including metal silicates and nitrided metal silicates. In one embodiment, the gate dielectric layer may be comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric layer may vary, but typically may have a thickness ranging from about 0.5 nm to about 10 nm. More preferably the gate dielectric 206 may have a thickness ranging from about 0.5 nm to about 3 nm.

After depositing the gate dielectric layer, a blanket polysilicon layer, which becomes a gate conductor 208 shown in FIG. 2A, may be formed on the gate dielectric layer using a known deposition technique such as, for example, physical vapor deposition (PVD), chemical vapor deposition (CVD), or evaporation. The blanket polysilicon layer may be doped or undoped. If doped, an in-situ doping deposition process may be employed in forming the blanket polysilicon layer. Alternatively, a doped blanket polysilicon layer can be formed by deposition, ion implantation, and annealing. The doping of the blanket polysilicon layer will shift the workfunction of the silicided metal gate, later formed. Illustrative examples of dopant ions include As, P, B, Sb, Bi, In, Al, Ga, Tl, or mixtures thereof. Typical doses for the ion implants are 1 E14 ($=1 \times 10^{14}$) to 1 E16 ($=1 \times 10^{16}$) atoms/cm$^2$ or more typically 1 E15 to 5 E15 atoms/cm$^2$. The thickness, i.e., height, of the blanket polysilicon layer may vary depending on the deposition process employed. Preferably, the blanket polysilicon layer may have a vertical thickness ranging from about 20 nm to about 180 nm. More preferably the blanket polysilicon layer may have a thickness ranging from about 40 nm to about 150 nm.

Although a specific description is provided for polysilicon gate conductors, the present disclosure is not limited to only that type of gate material. Instead, other types of gate conductor materials such as metal or metal alloy gates, silicide gates, conductive nitride gates, polySiGe and combinations thereof, including combinations with polysilicon, are also contemplated herein. In embodiments in which the gate conductor is not comprised of polysilicon or polySiGe, a NiSi, PtSi contact in accordance with the present invention is not formed on top of the gate region. In such cases, the dielectric cap 210 (defined below) typically, but not always, may remain on the gate conductor during the salicidation process.

After formation of the blanket polysilicon layer, a blanket dielectric capping layer may be formed atop the blanket polysilicon layer using a deposition process such as, for example, physical vapor deposition (PVD) or chemical vapor deposition (CVD). The blanket dielectric capping layer becomes the dielectric cap 210 shown in FIG. 2A. The blanket dielectric capping layer may be an oxide, nitride, oxynitride or any combination thereof. The blanket dielectric capping layer can be made of a different dielectric material than the pair of spacers 212a, 212b, defined in detail herein below. In one embodiment, a nitride such as, for example, $Si_3N_4$, is employed as the blanket dielectric capping layer. In one embodiment, the blanket dielectric capping layer may be an oxide such as $SiO_2$. Preferably, the blanket dielectric capping layer may have a vertical thickness ranging from about 20 nm to about 180 nm. More preferably the blanket dielectric capping layer may have a thickness ranging from about 30 nm to about 140 nm.

In one embodiment, where the gate conductor, e.g. 208, may be made from a silicon-containing material, a dielectric cap, e.g. 210, may not be required to form a silicide contact on the gate conductor, e.g. 208. However, in one embodiment, where the gate conductor, e.g. 208, may be made from a material which does not contain silicon, a dielectric cap, e.g. 210, may be required to form a silicide contact on the gate conductor, e.g. 208.

The blanket polysilicon layer and blanket dielectric capping layer are then patterned using conventional lithography techniques so as to provide patterned gate stacks. The patterned gate stacks may have the same dimension, i.e., length, or they can have variable dimensions to improve device performance. Each patterned gate stack may include the gate conductor 208 and the dielectric cap 210 located on top of the gate dielectric layer. The lithography steps may include applying a photoresist to the upper surface of the blanket dielectric capping layer, exposing the photoresist to a desired pattern of radiation and developing the exposed photoresist using a conventional resist developer. The pattern in the photoresist can then be transferred to the blanket dielectric capping layer and the blanket layer of polysilicon using one or more dry etching steps. In one embodiment, the patterned photoresist may be removed after the pattern has been transferred into the blanket dielectric capping layer. In one embodiment, the patterned photoresist may be removed after etching has been completed.

Suitable dry etching techniques that can be to form the patterned gate stacks may include, but are not limited to reactive ion etching (RIE), ion beam etching, plasma etching, or laser ablation. In one embodiment, the dry etching process employed may be selective to the gate dielectric layer, and therefore may not remove the gate dielectric layer. In one embodiment, this etching step may however be used to remove portions of the gate dielectric layer that are not protected by the gate stack, thereby forming the gate dielectric 206. A wet etching process can also be used to remove portions of the gate dielectric layer that are not protected by the gate stack. The patterned gate stack after etching the gate dielectric layer may include the gate dielectric 206, the gate conductor 208, and the dielectric cap 210.

The pair of spacers 212a, 212b may then be formed on exposed opposite sidewalls of each patterned gate stack. The pair of spacers 212a, 212b may be made from an insulator such as an oxide, nitride, oxynitride, or any combination thereof. The pair of spacers 212a, 212b may be typically made from a different material than the dielectric cap 210. In one embodiment the pair of spacers 212a, 212b may be made form a nitride. The pair of spacers 212a, 212b may be formed by conventional deposition and etching techniques.

The width of the pair of spacers 212a, 212b must be sufficiently wide enough such that the source and drain silicide contacts (to be subsequently formed) do not encroach underneath the edges of the gate stack. Typically, the source and drain silicide contacts do not encroach underneath the edges of the gate stack when the width of each of the pair of spacers, as measured at the bottom (along the surface of the substrate), ranges from about 15 nm to about 80 nm.

After spacer formation, the source/drain regions 214, 216 may be formed into the substrate 202. The source/drain regions 214, 216 can be formed using ion implantation process followed by an annealing process. The annealing process serves to activate the dopants that were implanted by a previous implant process. The conditions for the ion implantation and annealing are well known to persons having ordinary skill in the art. The phrase "source/drain regions" may include extension regions, halo regions, and deep source/drain regions.

In one embodiment, when the substrate does not include silicon, a Si-containing layer can be formed atop of the exposed portions of the substrate to provide a source for forming the silicide contacts. Illustrative examples of Si-containing materials that can be used may include, for example, Si, single crystal Si, polycrystalline Si, SiGe, and amorphous Si. This embodiment of the present invention is not illustrated in the drawings.

After formation of the source/drain regions 214, 216 a dielectric layer 220 may be deposited on top of the entire structure 200. The dielectric layer 220 may be formed from any of a variety of conventional dielectric materials, such as, silicon nitride or $SiO_2$. The dielectric layer 220 may be deposited using conventional techniques, such as, atomic layer deposition (ALD), physical vapor deposition (PVD), and chemical vapor deposition (CVD). Contact trenches 222, 224 may then be formed by etching through the dielectric layer 220 down to the source/drain regions 214, 216, as shown in the figure. Electrical contacts to the source/drain regions 214, 216 may be formed in the contact trenches 222, 224.

Figure 2B:
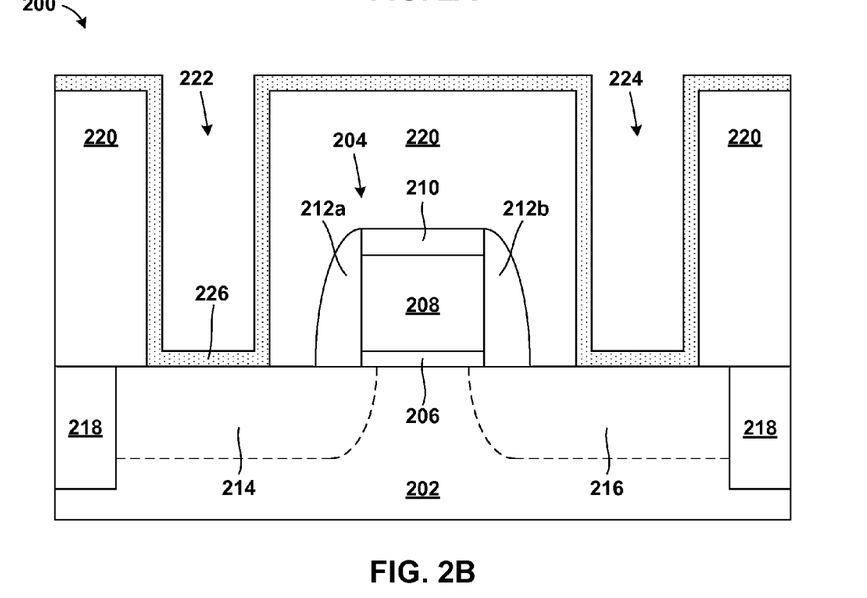
FIG. 2B a cross-sectional diagram of a step of a method of fabricating raised silicide contacts for a semiconductor device according to one exemplary embodiment.

Referring now to FIG. 2B, a metal alloy layer 226 may be deposited uniformly over the entire structure 200 as shown in the figure. The metal alloy layer 226 may be formed using conventional deposition techniques including, but not limited to: chemical vapor deposition (CVD), plasma-assisted CVD, high-density chemical vapor deposition (HDCVD), plating, sputtering, evaporation, and chemical solution deposition. The deposition of the metal alloy layer 226 may be continued until an initial thickness of about 25 nm or less, preferably about 15 nm or less, even more preferably about 10 nm or less, is produced.

In one embodiment, the metal alloy layer 226 may include a nickel-platinum (NiPt) alloy. The metal alloy layer 226 may include a nickel concentration ranging from about 70 to about 95 atomic percent. Preferably, nickel may be present in the alloy in an amount ranging from about 90 to about 95 atomic percent. The remainder may be platinum and, if present, another metal. In one embodiment, the metal alloy layer 226 may include NiPd, NiRe, Ti, TiTa, TiNb, or Co.

The other metal or alloying additive that can be optionally present in the NiPt alloy layer may include Pd, Rh, Ti, V, Cr, Zr, Nb, Mo, Ht, Ta, W, or Re. In one embodiment, the other alloying additive is Re. When present, the alloying additive is present in an amount ranging from about 0 to about 50 atomic percent with an amount ranging from about 0.1 to about 20 atomic percent being more typical. More preferably, the other metal is present in an amount ranging from about 0.5 to about 10 atomic percent.

Figure 2C:
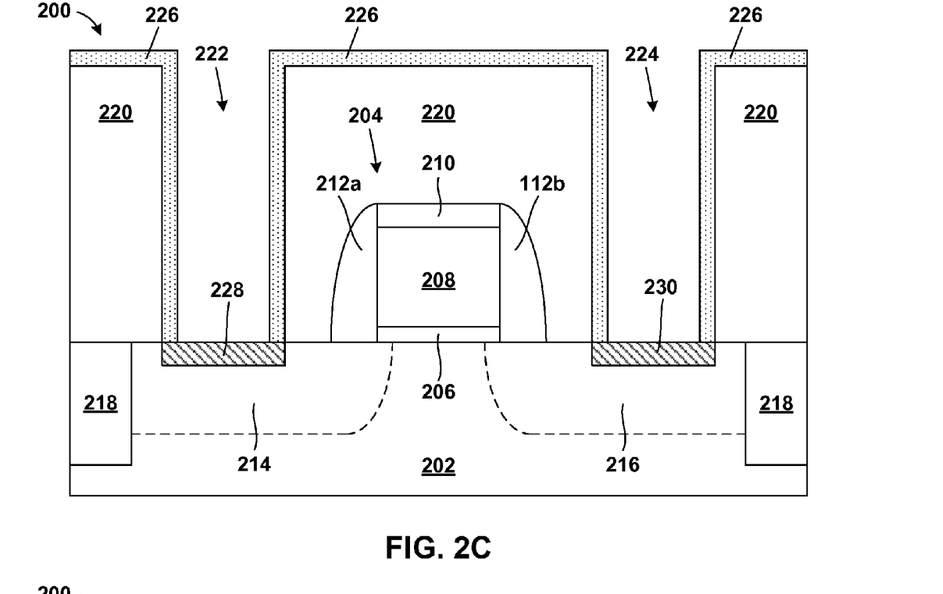
FIG. 2C a cross-sectional diagram of a step of a method of fabricating raised silicide contacts for a semiconductor device according to one exemplary embodiment.

Referring now to FIG. 2C, a first annealing step may be carried out at a relatively low annealing temperature, ranging from about 150° C. to about 500° C. using either a continuous heating regime or various ramp and soak heating cycles, for a duration ranging from about 1 second to about 1000 seconds. More preferably, the first annealing step may be carried out at an annealing temperature ranging from about 200° C. to about 400° C. and for a duration ranging from about 5 seconds to about 500 seconds. Most preferably, the first annealing step may be carried out at an annealing temperature ranging from about 250° C. to about 350° C. and for a duration from about 10 seconds to about 100 seconds. In one embodiment, the first annealing step may be initiated by raising the surrounding temperature of the entire structure from ambient temperature to the desired annealing temperature at a ramp rate from about 1° C./second to about 35° C./second, more preferably from about 5° C./second to about 25° C./second, and most preferably from about 10° C./second to about 20° C./second. Further, it is preferred that the first annealing step may be terminated by lowering the surrounding temperature of the entire structure to below 100° C. within a time period from about 10 seconds to about 1000 seconds.

The first annealing step, as described above, may be generally referred to as a low-temperature rapid thermal annealing (RTA) step. As a result of the low-temperature RTA step, nickel contained in the portions of the metal alloy layer 226 that are located directly over the source/drain regions 214, 216 of the semiconductor substrate 202 reacts with silicon contained in the source/drain regions 214, 216 to form embedded silicide contacts 228, 230, after the low-temperature RTA a portion of the metal alloy layer 226 remains on a sidewall of the contact trenches 222, 224 and on top of the dielectric layer 220, as shown in FIG. 1C. The portion of the metal alloy layer 226 remaining may contain un-reacted nickel. The embedded silicide contacts 228, 230 contain at least $Ni_2Si$, formed by the reaction between nickel and silicon at the relatively low annealing temperature and may be characterized by a relatively higher resistivity in comparison with NiSi. The embedded silicide contacts 228, 230 may further contain platinum, which may not react with silicon to form a silicide at the low annealing temperature.

The embedded silicide contacts 228, 230, formed after the low-temperature RTA step, may extend into the silicon material of the source/drain regions 214, 216 about 5 nm to about 30 nm, with a depth from about 5 nm to about 20 nm being even more typical.

Figure 2D:
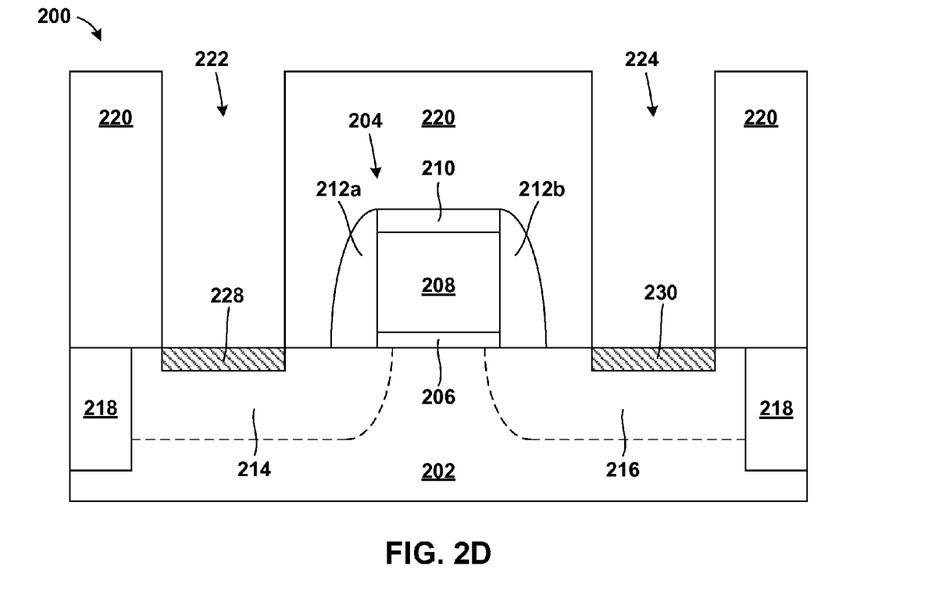
FIG. 2D a cross-sectional diagram of a step of a method of fabricating raised silicide contacts for a semiconductor device according to one exemplary embodiment.

Referring now to FIG. 2D, after the low-temperature RTA step, a nickel-only etching process may be carried out to remove substantially all un-reacted nickel of the remaining portion of the metal alloy layer 226 located on the sidewall of the contact trenches 222, 224 and on top of the dielectric layer 220. The nickel-only etching process may not remove un-reacted platinum from the remaining portion of the metal alloy layer 226. The nickel-only etching process may not remove nickel silicide (i.e., $Ni_2Si$) from the embedded silicide contacts 228, 230. Therefore, the embedded silicide contacts 228, 230 remain substantially intact.

In one embodiment, the nickel-only etching process may be carried out by using an etching solution that contains one or more oxidizers such as, for example, sulfuric peroxide, hydrogen peroxide, sulfuric acid, potassium permanganate, hydrochloric acid, ferric chloride, persulfate (e.g., ammonium persulfate, sodium persulfate, or potassium persulfate), nitric acid, a ceric compound (such as, for example, ceric ammonium nitrate), or some combination thereof. In one embodiment, the nickel-only etching process can be carried out using a solution that contains from about 1% to 30% by volume of hydrogen peroxide and from about 10% to about 90% by volume of sulfuric acid.

Figure 2E:
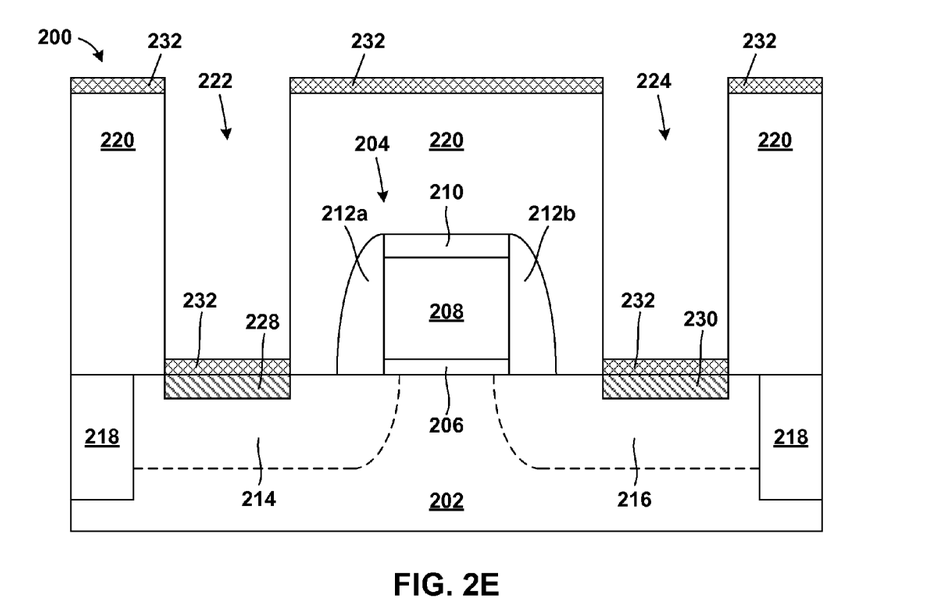
FIG. 2E a cross-sectional diagram of a step of a method of fabricating raised silicide contacts for a semiconductor device according to one exemplary embodiment.

Referring now to FIG. 2E, a silicon layer 232 may be deposited anisotropically over the entire structure 200. The silicon layer 232 may be formed using a gas cluster implant deposition technique which accelerates clusters of silicon atoms causing them to penetrate the surface at which they are directed. Each cluster may contain thousands of silicon atoms. This technique allows for the deposited silicon atoms to penetrate through a surface oxide that may form on the top surface of a self-aligned silicide and react with the $Ni_2Si$ silicide, i.e. the embedded silicide contacts 228, 230. Due to the directional nature of the gas cluster implant deposition technique the silicon layer 232 may only be deposited on the top surface of the dielectric layer 220 and at a bottom of the contact trenches 222, 224.

Conventional deposition techniques such as, for example, sputter deposition, physical vapor deposition (PVD), chemical vapor deposition (CVD), atomic layer deposition (ALD), and molecular beam epitaxy (MBE) may not be used because they do not have the appropriate energetic deposition needed to penetrate through the surface oxide formed on the top surface of the silicide. The silicon layer 232 may have a thickness ranging from about 2 nm to about 10 nm. In one embodiment, the silicon layer 232 may have a thickness ranging from about 5 nm to about 7 nm.

Figure 2F:
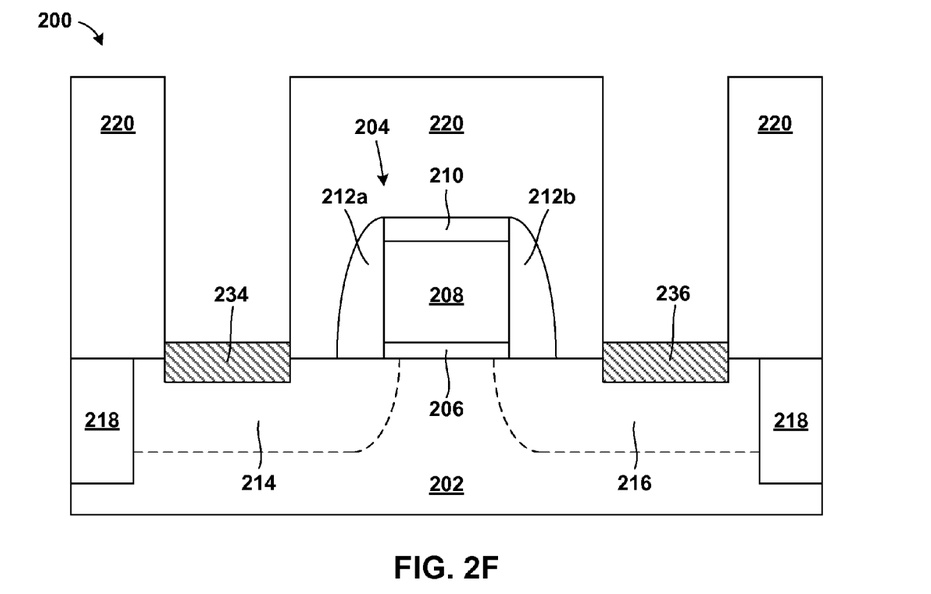
FIG. 2F a cross-sectional diagram of a step of a method of fabricating raised silicide contacts for a semiconductor device according to one exemplary embodiment.

Now referring to FIG. 2F, a second annealing step may be carried out at a relatively high annealing temperature, ranging from about 300° C. to about 900° C. using either a continuous heating regime or various ramp and soak heating cycles, for a duration ranging from about 0.1 milliseconds to about 600 seconds. More preferably, the second annealing step may be carried out at an annealing temperature ranging from about 350° C. to about 550° C. Most preferably, the second annealing step may be carried out at an annealing temperature ranging from about 400° C. to about 500° C. and for a duration from about 10 seconds to about 100 seconds. In one embodiment, referred to as a millisecond anneal, the second annealing step may be carried out at an annealing temperature ranging from about 650° C. to about 850° C. for a duration ranging from 0.2 milliseconds to about 1 milliseconds. In one embodiment, the second annealing step may be initiated by raising the surrounding temperature of the entire structure from ambient temperature to the desired annealing temperature at a ramp rate from about 1° C./second to about 35° C./second, more preferably from about 5° C./second to about 25° C./second, and most preferably from about 10° C./second to about 20° C./second. Further, the second annealing step may be terminated by lowering the surrounding temperature of the entire structure to below 100° C. within a time period from about 10 seconds to about 600 seconds.

The second annealing step, as described above, may be generally referred to as a high-temperature rapid thermal annealing (RTA) step. As a result of the high-temperature RTA step, $Ni_2Si$ contained in the embedded silicide contacts 228, 230 (shown in FIG. 1E) further reacts with silicon in the silicon layer 232 (shown in FIG. 1E) to form completely silicidated, raised silicide contacts 234, 236 as shown in FIG. 1F. The raised silicide contacts 234, 236 may contain NiSi that is characterized by a relatively lower resistivity than $Ni_2Si$.

The raised silicide contacts 234, 236, formed after the high-temperature RTA step, may have a thickness ranging from about 10 nm to about 20 nm. The raised silicide contacts 234, 236 may extend above the Si material of the source/drain regions 214, 216 about 5 nm to about 15 nm, with a height above the top surface of the semiconductor substrate from about 7 nm to about 10 nm being even more typical. The raised silicide contacts 234, 236 may be thicker than the embedded silicide contacts 228, 230

By using the silicon layer 232 (shown in FIG. 1E) increased control over the formation and morphology of the raised silicide contacts 234, 236 may be achieved. Furthermore, risk of junction leakage may be reduced as a result of the increase control over formation and morphology which may result in higher production yield. The increased control over the formation of the silicide contacts yields raised silicide contacts having uniform depth, or thickness, as well as uniform encroachment of the silicide beneath the gate stack. Both uniform depth and uniform encroachment further reduce the risk of junction leakage.

Note that both the first and second annealing steps may be carried out in a gas atmosphere, e.g., He, Ar, $N_2$, or forming gas. They may be carried out in different atmospheres or in the same atmosphere. For example, He may be used in both annealing steps, or He can be used in the first annealing step and a forming gas may be used in the second annealing step. In one embodiment, the first or second or both annealing steps may be carried out in an inert atmosphere containing less than 10 ppm oxygen.

In one embodiment, the source/drain regions 214, 216 may include SiGe. The deposition of the silicon layer 232 and subsequent formation of raised silicide contacts on top of SiGe source/drain regions may result in the formation of silicide contacts having a decreased concentration of Ge. Decreasing the concentration of Ge in the silicide contacts produces a more robust and thermally stable silicide contact.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

What is claimed is:

1. A method for forming a raised silicide contact, the method comprising:
  depositing a layer of silicon directly on top of a silicide partially formed in a silicon containing substrate at a bottom of a contact trench in a dielectric layer above the silicon containing substrate, wherein the silicon layer is deposited anisotropically using a gas cluster implant technique which accelerates clusters of silicon atoms causing them to penetrate a surface oxide on a top surface of the silicide, a width of the silicide is substantially equal to a width of the contact trench;
  heating the silicide including the silicon layer to a temperature from about 300° C. to about 950° C. by raising the temperature from an ambient temperature at a ramp rate from about 1° C./sec to about 35° C./sec, holding the temperature for less than 600 seconds in an inert atmosphere containing less than about 10 ppm oxygen, and lowering the temperature below 100° C. within a time period from about 10 to about 600 seconds causing silicon from the layer of silicon to react with the remaining silicide partially formed in the silicon containing substrate; and
  forming a raised silicide from the layer of silicon, wherein the thickness of the raised silicide is greater than the thickness of the silicide and the raised silicide protrudes above a top surface of the silicon containing substrate.

2. The method of claim 1, wherein the silicide comprises a metal selected from the group consisting of nickel, platinum, cobalt, titanium, erbium, niobium, palladium, rhodium, vanadium, chromium, zirconium, molybdenum, hafnium, tantalum, tungsten, rhenium, and combinations thereof.

3. The method of claim 1, wherein the silicide comprises nickel and platinum.

4. The method of claim 1, wherein depositing the layer of silicon comprises depositing a layer of silicon having a thickness ranging from 2 nm to 10 nm.

5. The method of claim 1, wherein the raised silicide has a total vertical thickness ranging from 10 nm to 20 nm.

6. The method of claim 1, wherein the raised silicide protrudes above the top surface of the silicon containing substrate by 5 nm to 15 nm.

7. The method of claim 1, wherein the silicide is located in a semiconductor device region, the semiconductor device region comprising at least one of undoped silicon, n-doped silicon, p-doped silicon, single crystal silicon, polycrystalline silicon, amorphous silicon, SiGe, SiGeC, and combinations thereof.

8. The method of claim 1, further comprising:
etching the silicon containing substrate selective to the silicide causing only an un-reacted nickel from formation of the silicide to be substantially removed from atop the silicon containing substrate.

9. The method of claim 8, wherein etching the silicon containing substrate comprises an etching solution, wherein the etching solution comprises at least one of a sulfuric peroxide, hydrogen peroxide, sulfuric acid, potassium permanganate, hydrochloric acid, ferric chloride, persulfate, nitric acid, a ceric compound, and some combination thereof.

10. The method of claim 1, wherein the raised silicide has a sheet resistance ranging from 15 ohms to 45 ohms.

11. A method comprising:
etching a contact trench in a dielectric layer above a semiconductor substrate, the contact trench exposing a source-drain region of the semiconductor substrate;
forming a silicide contact embedded in the source-drain region of the substrate exposed at a bottom of the contact trench;
depositing, anisotropically, a silicon layer directly on top of the silicide using a gas cluster implant technique to accelerate clusters of silicon atoms causing them to penetrate a surface oxide on a top surface of the silicide contact; and
heating the silicide contact and the silicon layer to a temperature from about 300° C. to about 950° C. by raising the temperature from an ambient temperature at a ramp rate from about 1° C./sec to about 35° C./sec, holding the temperature for less than 600 seconds in an inert atmosphere containing less than about 10 ppm oxygen, and lowering the temperature below 100° C. within a time period from about 10 to about 600 seconds causing silicon from the silicon layer to react with the silicide contact embedded in the semiconductor substrate to form a raised silicide contact.

12. A method comprising:
forming a silicide partially embedded in a semiconductor substrate, the silicide is self-aligned within a contact trench formed in a dielectric layer above the semiconductor substrate;
depositing, anisotropically, a silicon layer directly on top of the silicide using a gas cluster implant technique to accelerate clusters of silicon atoms causing them to penetrate a surface oxide on a top surface of the silicide contact; and
heating the silicide and the silicon layer to a temperature from about 300° C. to about 950° C. by raising the temperature from an ambient temperature at a ramp rate from about 1° C./sec to about 35° C./sec, holding the temperature for less than 600 seconds in an inert atmosphere containing less than about 10 ppm oxygen, and lowering the temperature below 100° C. within a time period from about 10 to about 600 seconds causing silicon from the silicon layer to react with the silicide partially embedded in the semiconductor substrate to form a raised silicide contact.

13. The method of claim 1, wherein the raised silicide contact is self-aligned within the contact trench.

14. The method of claim 11, further comprising:
heating a metal-alloy layer, conformally deposited within the contact trench and on top of the silicide contact, to a temperature from about 150° C. to about 500° C. by raising the temperature from an ambient temperature at a ramp rate from about 1° C./sec to about 35° C./sec, holding the temperature for less than 1000 seconds in an inert atmosphere containing less than about 10 ppm oxygen, and lowering the temperature below 100° C. within a time period from about 10 to about 1000 seconds causing a metal-alloy from the metal-alloy layer to react with silicon of the semiconductor substrate to form the silicide contact; and
removing un-reacted metal-alloy after formation of the silicide contact using an etching solution comprising at least one of sulfuric peroxide, hydrogen peroxide, sulfuric acid, potassium permanganate, hydrochloric acid, ferric chloride, persulfate, nitric acid, a ceric compound, and some combination thereof.

15. The method of claim 11, wherein the silicide comprises a metal selected from the group consisting of nickel, platinum, cobalt, titanium, erbium, niobium, palladium, rhodium, vanadium, chromium, zirconium, molybdenum, hafnium, tantalum, tungsten, rhenium, and combinations thereof.

16. The method of claim 11, wherein the raised silicide protrudes above the top surface of the silicon containing substrate by 5 nm to 15 nm.

17. The method of claim 11, wherein the raised silicide has a sheet resistance ranging from 15 ohms to 45 ohms.

18. The method of claim 12, wherein the raised silicide protrudes above the top surface of the silicon containing substrate by 5 nm to 15 nm.

19. The method of claim 12, wherein the raised silicide has a sheet resistance ranging from 15 ohms to 45 ohms.

* * * * *